United States Patent
Mizumura et al.

(10) Patent No.: US 10,622,484 B2
(45) Date of Patent: Apr. 14, 2020

(54) THIN FILM TRANSISTOR, MANUFACTURING PROCESS FOR THIN FILM TRANSISTOR, AND LASER ANNEALING APPARATUS

(71) Applicant: V TECHNOLOGY CO., LTD., Yokohama-shi (JP)

(72) Inventors: Michinobu Mizumura, Yokohama (JP); Makoto Hatanaka, Yokohama (JP); Tetsuya Kiguchi, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 0 days.

(21) Appl. No.: 16/183,424

(22) Filed: Nov. 7, 2018

(65) Prior Publication Data
US 2019/0074384 A1 Mar. 7, 2019

Related U.S. Application Data (60) Division of application No. 15/583,726, filed on May 1, 2017, now Pat. No. 10,211,343, which is a (Continued)

(30) Foreign Application Priority Data

Nov. 25, 2014 (JP) .................. 2014-238202

(51) Int. Cl.
*H01L 29/786* (2006.01)
*H01L 21/20* (2006.01)
(Continued)

(52) U.S. Cl.
CPC .. *H01L 29/78678* (2013.01); *H01L 21/02675* (2013.01); *H01L 21/20* (2013.01);
(Continued)

(58) Field of Classification Search
None
See application file for complete search history.

(56) References Cited

U.S. PATENT DOCUMENTS 6,274,414 B1    8/2001   Ogata
6,452,213 B1 *  9/2002   Kimura ............... H01L 27/1296
                                              257/66
(Continued)

FOREIGN PATENT DOCUMENTS

JP    2001-127302 A    5/2001
JP    2002-222957 A    8/2002
(Continued)

OTHER PUBLICATIONS

Japanese Office Action from Japanese Patent Application No. 2014-238202, dated Jul. 24, 2018, 7 pages.
(Continued)

*Primary Examiner* — Shaun M Campbell
(74) *Attorney, Agent, or Firm* — Morgan, Lewis & Bockius LLP (57) ABSTRACT

The present invention provides a thin film transistor including a gate electrode, a source electrode, a drain electrode, and a semiconductor layer, which are laminated on a substrate. The semiconductor layer is a polysilicon thin film. The polysilicon thin film in regions corresponding to the source electrode and the drain electrode has a smaller crystal grain size than that of the polysilicon thin film in a channel region between the source electrode and the drain electrode.

3 Claims, 10 Drawing Sheets

Related U.S. Application Data continuation of application No. PCT/JP2015/082554, filed on Nov. 19, 2015.

(51) Int. Cl.
*H01L 27/12* (2006.01)
*H01L 29/04* (2006.01)
*H01L 21/02* (2006.01)
*H01L 21/67* (2006.01)
*H01L 29/66* (2006.01)

(52) U.S. Cl.
CPC .... *H01L 21/67115* (2013.01); *H01L 27/1281* (2013.01); *H01L 29/04* (2013.01); *H01L 29/66765* (2013.01); *H01L 29/78618* (2013.01); *H01L 29/78621* (2013.01)

(56) References Cited

U.S. PATENT DOCUMENTS

| | | | | |
|---|---|---|---|---|
| 6,906,346 | B2* | 6/2005 | Nishitani | H01L 21/2026 257/70 |
| 2002/0100909 | A1* | 8/2002 | Yamaguchi | H01L 27/12 257/59 |
| 2004/0248386 | A1* | 12/2004 | Nishitani | H01L 21/2026 438/478 |
| 2005/0224876 | A1* | 10/2005 | Kuo | H01L 21/268 257/347 |
| 2006/0186415 | A1* | 8/2006 | Asano | H01L 21/2026 257/72 |
| 2007/0212858 | A1 | 9/2007 | Fujino | |
| 2007/0290200 | A1 | 12/2007 | Asano | |
| 2008/0054266 | A1 | 3/2008 | Machida | |
| 2013/0153028 | A1* | 6/2013 | Hayashi | H01L 21/02532 136/258 |
| 2015/0076504 | A1 | 3/2015 | Im | |

FOREIGN PATENT DOCUMENTS

| | | |
|---|---|---|
| JP | 2005-294851 A | 10/2005 |
| JP | 2011-029411 A | 2/2011 |
| JP | 2007-335780 A | 12/2017 |
| WO | 2013/005250 A1 | 1/2013 |
| WO | 2013/172965 A1 | 11/2013 |

OTHER PUBLICATIONS

International Preliminary Report on Patentability from PCT/JP2015/082554, dated Jun. 8, 2017.

* cited by examiner

WHERE $\Delta = D \times d / \{(D+d) \times 5\}$

FIG.10

WHERE d/D REPRESENTS
REDUCED SCALING FACTOR

THIN FILM TRANSISTOR, MANUFACTURING PROCESS FOR THIN FILM TRANSISTOR, AND LASER ANNEALING APPARATUS

CROSS-REFERENCE TO RELATED APPLICATIONS

This application is a divisional application of U.S. patent application Ser. No. 15/583,726, filed on May 1, 2017, now U.S. Pat. No. 10,211,343, which is a continuation application of PCT/JP2015/082554, filed on Nov. 19, 2015, which claims priority to Japanese Patent Application No. 2014-238202, filed on Nov. 25, 2014, the entirety of each of which is incorporated herein by reference.

BACKGROUND OF THE INVENTION

1. Field of the Invention

The present invention relates to a thin film transistor including a semiconductor layer in the form of a polysilicon thin film, and more particularly to a thin film transistor that aims at the structure capable of reducing an off-leakage current through a simple manufacturing process, and a manufacturing process and a laser annealing apparatus for such thin film transistor.

2. Description of Related Art

Thin film transistors (hereinafter referred to as "TFTs") generally have the structure including a gate electrode, a source electrode, a drain electrode, and a semiconductor layer, which are laminated on a substrate. Of those, a TFT using a polysilicon thin film as the semiconductor layer shows high electron mobility and finds its application in low power displays.

The polysilicon thin film serving as the semiconductor layer is formed by uniformly applying laser annealing to at least a region corresponding to a gate electrode out of an amorphous silicon thin film applied onto the entire substrate surface so as to crystallize the region into polysilicon. In this case, the amorphous silicon thin film in regions corresponding to source and drain electrodes are subjected to the annealing treatment like a channel region between the source and drain electrodes, and turned into a polysilicon thin film. This may cause a problem of increasing electric field intensity between the electrodes and in turn increasing an off-leakage current in the TFT.

To overcome such problem, conventional TFTs adopt a lightly doped drain (LDD) structure in which impurities are doped into portions of the polysilicon thin film between the channel region and a region for the source electrode and between the channel region and a region for the drain electrode so as to lower carrier concentration in the doped portions compared to the channel region (see, for example, JP 2007-335780 A).

To that end, the conventional TFTs require the step of doping impurities into the polysilicon thin film, leading to a complicated manufacturing process and high manufacturing costs.

SUMMARY OF THE INVENTION

In view of some of the above problems, it is an object of the present invention to provide a thin film transistor that aims at the structure capable of reducing an off-leakage current through a simple manufacturing process, and a manufacturing process and a laser annealing apparatus for such thin film transistor.

In order to achieve the above object, the present invention provides a thin film transistor including a gate electrode, a source electrode, a drain electrode, and a semiconductor layer, which are laminated on a substrate, in which the semiconductor layer is a polysilicon thin film, and the polysilicon thin film in regions corresponding to the respective source and drain electrodes has a smaller crystal grain size than that of the polysilicon thin film in a channel region between the source and drain electrodes.

The present invention also provides a manufacturing process for a thin film transistor that includes a gate electrode, a source electrode, a drain electrode, and a semiconductor layer, which are laminated on a substrate, the process including a laser annealing step of irradiating laser light to at least a region corresponding to the gate electrode out of an amorphous silicon thin film applied onto the substrate to form a polysilicon thin film that serves as the semiconductor layer, wherein in the laser annealing step, laser light is irradiated to the polysilicon thin film in regions corresponding to the respective source and drain electrodes at a smaller fluence than in a channel region between the source and drain electrodes so that the regions corresponding to the respective source and drain electrodes have a smaller crystal grain size than that in the channel region.

The present invention also provides a laser annealing apparatus for applying laser annealing to an amorphous silicon thin film in at least a region corresponding to a gate electrode in a thin film transistor including the gate electrode, a source electrode, a drain electrode, and a semiconductor layer, which are laminated on a substrate, so as to form a polysilicon thin film that serves as the semiconductor layer, the apparatus including: a laser irradiation optical system adapted to irradiate laser light onto the substrate; and control means device adapted to control a laser fluence to apply laser annealing to the polysilicon thin film in regions corresponding to the respective source and drain electrodes at a smaller laser fluence than in a channel region between the source and drain electrodes so that the polysilicon thin film in the regions corresponding to the respective source and drain electrodes has a smaller crystal grain size than that in the channel region.

According to the present invention, the polysilicon thin film in the regions corresponding to the respective source and drain electrodes can have a smaller crystal grain size than that in the channel region between the source and drain electrodes out of the polysilicon thin film only by controlling a laser fluence at the time of applying laser annealing to the amorphous silicon thin film. Accordingly, the mobility of electrons can be lowered in the regions corresponding to the respective source and drain electrodes compared to the channel region, and an off-leakage current in the TFT can be reduced.

If uniformly annealing the channel region alone, there is a risk that after that annealing treatment, the source and drain electrodes may be formed on the semiconductor layer, not in alignment with the channel region, such offset affects electrical characteristics of the TFT. According to the present invention, however, the crystal grain size of the polysilicon thin film for the semiconductor layer is changed in stages at the regions corresponding to the respective source and drain electrodes and the channel region, whereby the acceptable level of offset can be raised and thus, the TFT can be easily manufactured.

BRIEF DESCRIPTION OF THE DRAWINGS

FIGS. 6A and 6B show one structural example of a shadow mask and a microlens array that are used for the laser annealing apparatus according to the present invention, in which FIG. 6A is a plan view thereof and FIG. 6B is a cross-sectional view taken along line O-O of FIG. 6A.

FIGS. 9A and 9B are explanatory views showing another structural example of the shadow mask and the microlens array that are used for the laser annealing apparatus according to the present invention, in which FIG. 9A shows an aperture array example for when microlenses are arranged in conformity with gate electrode array and FIG. 9B shows a microlens array example for when apertures are formed in conformity with gate electrode array.

DESCRIPTION OF PREFERRED EMBODIMENTS

Figure 1:
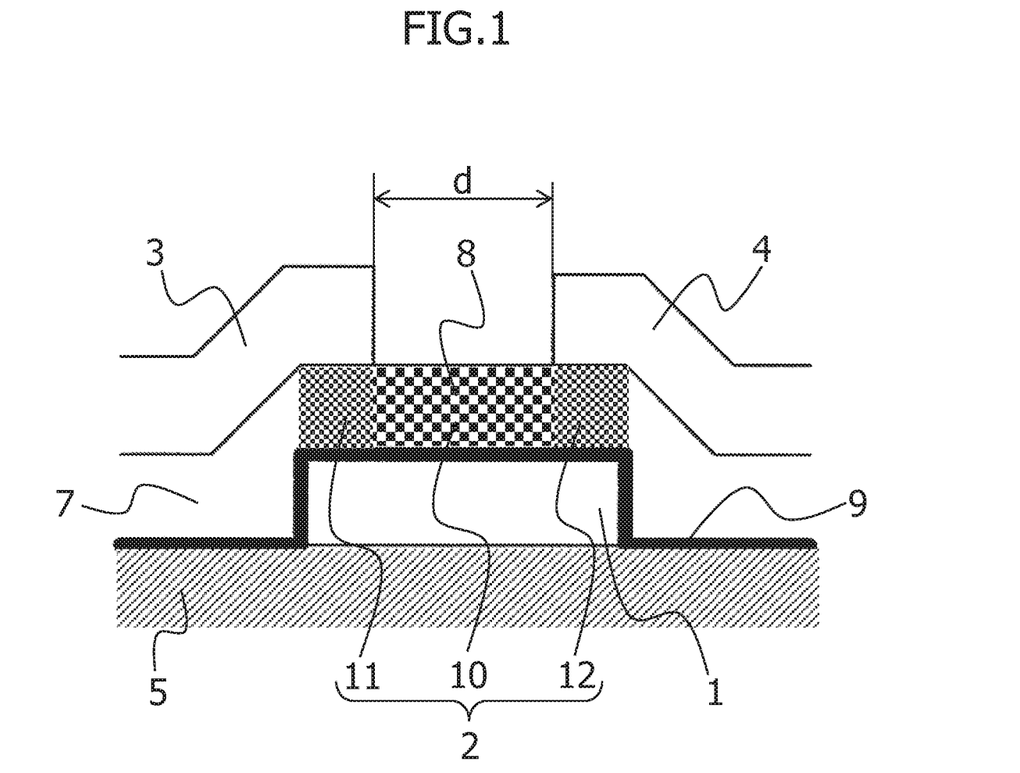
FIG. 1 is a cross-sectional view showing a thin film transistor according to an embodiment of the present invention.

An embodiment of the present invention will be described in detail below with reference to the accompanying drawings. FIG. 1 is a cross-sectional view showing a thin film transistor according to an embodiment of the present invention. The thin film transistors (TFTs) are provided at intersections between plural data lines and gate lines that crisscross each other on a TFT substrate so as to drive pixel electrodes of a display. The respective TFTs are composed of a gate electrode 1, a semiconductor layer 2, a source electrode 3, and a drain electrode 4.

The gate electrodes 1 are formed in a matrix at regular array pitches on the substrate 5 in the form of transparent glass and also are electrically connected to plural gate lines 6 (see FIGS. 3A to 3E) extending in parallel to the horizontal direction of the substrate 5 so as to receive scanning information from a gate drive circuit provided outside a display region.

The semiconductor layer 2 is formed over the gate electrode 1. The semiconductor layer 2 is a polysilicon thin film 8 formed by irradiating laser light L as UV light to at least a region corresponding to the gate electrode 1 out of an amorphous silicon thin film 7 applied onto the substrate 5 so as to subject the amorphous silicon thin film 7 to laser annealing. The semiconductor layer 2 is formed on the gate electrode 1 with an insulating film 9 being interposed therebetween. Also, the semiconductor layer 2 has such structure that the polysilicon thin film 8 in regions corresponding to the source electrode 3 and the drain electrode 4 as described below, has a smaller crystal grain size than that in a channel region 10 between the source electrode 3 and the drain electrode 4.

The thus-structured semiconductor layer 2 is obtained by irradiating the laser light L for laser annealing to the amorphous thin film in regions corresponding to the source electrode 3 and the drain electrode 4 at a smaller fluence than that in the channel region 10. Hereinafter, the regions of the semiconductor layer 2 corresponding to the source electrode 3 and the drain electrode 4 are referred to as a "source region 11" and a "drain region 12", respectively.

To be specific, as shown in FIGS. 2A to 3E, the laser annealing is performed such that the irradiation position of pulse laser light L (hereinafter simply referred to as "laser light L"), which is shaped to be irradiated in the same shape as the above channel region 10, is shifted stepwise with some overlap in the region corresponding to the gate electrode 1 from one end thereof on the source electrode 3 side or the drain electrode 4 side to the other end. This embodiment shows the case where the irradiation position of the laser light L is shifted stepwise from the source electrode 3 side toward the drain electrode 4 side (as indicated by arrow in FIGS. 3A to 3D).

Figure 3A:
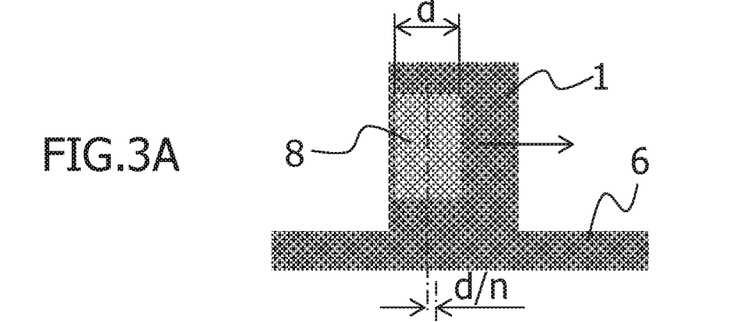
FIGS. 3A to 3E are explanatory plan views showing laser annealing for the thin film transistor according to the present invention.
Figure 3B:
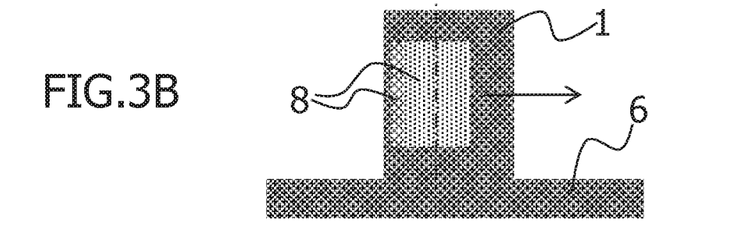

More specifically, when the laser light L is irradiated for laser annealing in n shots where n is an integer not smaller than three, the distance the irradiation position thereof moves stepwise (also called an amount of stepwise movement) is set equal to 1/n of width d of the channel region 10 in the opposing direction of the source electrode 3 and the drain electrode 4 (the direction of arrow in FIGS. 3A and 3B).

To give a specific example thereof, provided that the source-drain width of the channel region 10 is, for example, 4 μm and laser light is irradiated for laser annealing in, for example, twenty shots in total, the amount of stepwise movement is set to 0.2 μm (i.e., 4 μm/20=0.2 μm).

The laser light L may be irradiated each time a laser irradiation optical system 14 (described later and illustrated in FIG. 5) and the substrate 5 are relatively moved stepwise by d/n in one shot. Alternatively, the laser light L may be irradiated each time the substrate 5 moves d/n while being scanned at a constant speed with respect to the gate electrode 1 from the drain electrode 4 side toward the source electrode 3 side (opposite direction to arrow in FIGS. 3A to 3E). Besides the above, it is possible to adopt a shadow mask 21 (see FIGS. 6A and 6B) having plural apertures 25 through which the light is irradiated to positions apart from one another in the direction extending from the drain electrode 4 side to the source electrode 3 side (opposite direction to arrow in FIGS. 3A to 3E) by "$w_2$–d/n" where $w_2$ indicates an array pitch of the gate electrodes 1 in the same direction. In this case, the laser light L may be irradiated each time the substrate 5 moves away from the first irradiation position by $w_2$ while being scanned at a constant speed in the same direction.

On the semiconductor layer 2, the source electrode 3 is formed at one end of the gate electrode 1. The source electrode 3 is electrically connected to a data line (not shown) that crosses the gate line 6, and adapted to receive a data signal from a source drive circuit provided outside a display region.

On the semiconductor layer 2, the drain electrode 4 is formed at the other end of the gate electrode 1. The drain electrode 4 supplies a data signal received via the data line and the source electrode 3 to a pixel electrode (not shown) of the display. The drain electrode 4 is electrically connected to the pixel electrode.

Moreover, on the source electrode 3 and the drain electrode 4, an insulating film is formed as a protective film (not shown).

Next, described is a manufacturing process for the above TFT. The manufacturing process for a TFT according to the present invention is directed to manufacturing a TFT having the gate electrode 1, the source electrode 3, the drain electrode 4, and the semiconductor layer 2 laminated on the substrate 5. The process includes a laser annealing step that irradiates the laser light L as UV light to at least a region corresponding to the gate electrode 1 out of the amorphous silicon thin film 7 formed on the substrate 5 to obtain the polysilicon thin film 8 that serves as the semiconductor layer 2.

Note that since the TFT of the present invention is the same as a well-known TFT except the structure of the semiconductor layer 2, the manufacturing process therefor basically follows conventional techniques. Here, the formation of the semiconductor layer 2 distinguishable from the conventional ones, especially, the laser annealing step is described.

The laser annealing step in the manufacturing process for the TFT according to the present invention has a feature that the laser light L is irradiated for laser annealing to the source region 11 and the drain region 12 at a smaller fluence than that in the channel region 10 such that the crystal grain size of the polysilicon thin film 8 can be smaller at the source region 11 and the drain region 12 than the channel region 10.

More specifically, the laser annealing step is performed such that the irradiation position of the laser light L, which is shaped to be irradiated in the same shape as the channel region 10, is shifted stepwise in the region corresponding to the gate electrode 1 from one end on the source electrode 3 side or the drain electrode 4 side to the other end, with some overlap in the opposing direction of the source electrode 3 and the drain electrode 4.

More specifically, the laser annealing step is performed as follows: if the laser light L is irradiated for laser annealing in n shots where n is an integer not smaller than three, the distance the irradiation position of the laser light L moves stepwise (amount of stepwise movement) is set equal to 1/n of the width d of the channel region 10 in the opposing direction of the source electrode 3 and the drain electrode 4.

Figure 2A:
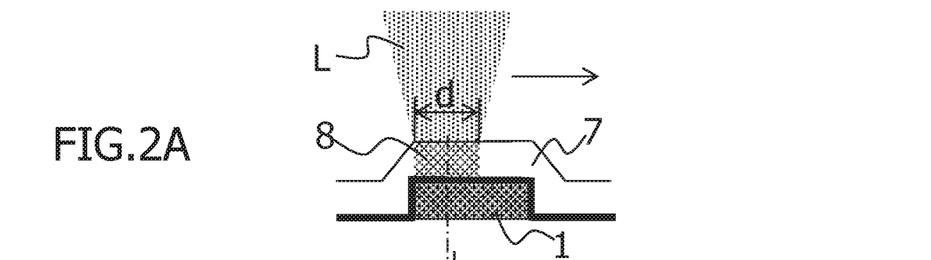
FIGS. 2A to 2E are explanatory sectional views showing laser annealing for a thin film transistor according to the present invention.

Referring to FIGS. 2A to 3E, the laser annealing step is described below. In this example, the laser light is irradiated in, e.g., five shots for laser annealing. First, as shown in FIG. 2A and FIG. 3A, one shot (first shot) of the laser light L as UV light is applied to the amorphous silicon thin film 7 at an end portion on the source electrode 3 side in the region corresponding to the gate electrode 1. Note that the laser light L has been shaped to be irradiated onto the amorphous silicon thin film 7 in the same shape as the channel region 10. As a result of irradiating the laser light L, the irradiated portion of the amorphous silicon thin film 7 is instantaneously heated and melted, and silicon molecular bonds are changed from the amorphous structure to the polycrystalline one to obtain the polysilicon thin film 8.

A laser used in this example is a YAG laser having the wavelength of 355 nm or an excimer laser having the wavelength of 308 nm.

Subsequently, the irradiation position of the laser light L is shifted stepwise by d/5 in the direction toward the drain electrode 4 (the direction of arrow in FIG. 2A and FIG. 3A). Then, one shot (second shot) of the laser light L is applied in the same way as above.

Figure 2B:
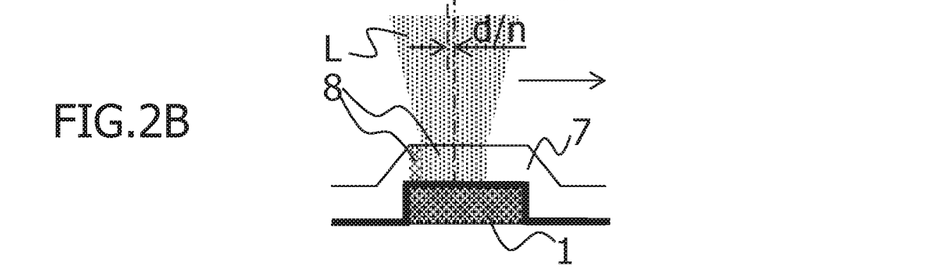

To be specific, as shown in FIG. 2A, the laser light L is moved stepwise in the direction of arrow relative to the substrate 5 (or the gate electrode 1) and then irradiated in one shot (second shot) onto the gate electrode 1 at a position apart from the first irradiation position of FIG. 2A and FIG. 3A by d/5 in the direction of arrow as shown in FIG. 2B and FIG. 3B. As a result of irradiating the laser light L, the irradiated portion of the amorphous silicon thin film 7 is instantaneously heated and melted, and the silicon molecular bonds are changed from the amorphous structure to the polycrystalline one to obtain the polysilicon thin film 8.

In this case, an overlap between the first and second shots of the laser light L (i.e., an overlap between the portion irradiated with the first shot and the portion irradiated with the second shot) has been exposed to a higher laser fluence than the portion exposed to the first shot alone. At such overlap, the irradiation energy is high and crystallization (crystal growth) is promoted. Thus, the crystal grain size of the polysilicon thin film 8 at such overlap is larger than that of the other portion of the polysilicon thin film 8.

Figure 2C:
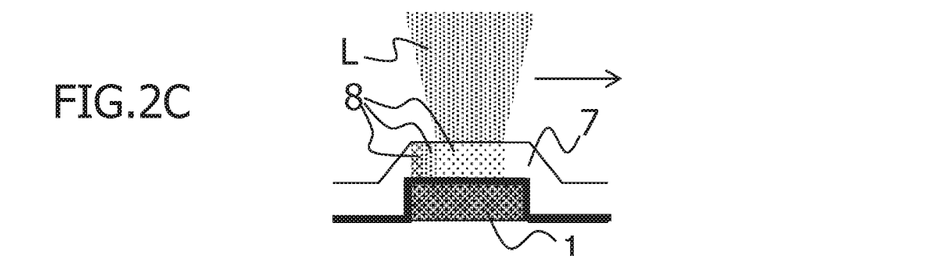
Figure 3C:
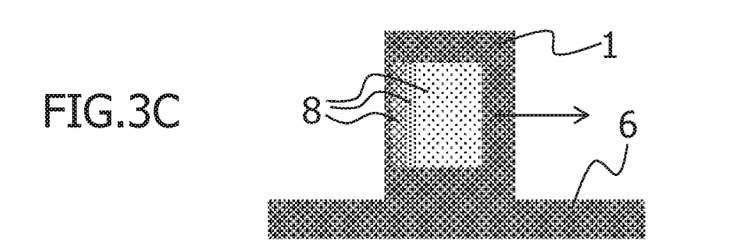

Next, similar to the above, the laser light L is moved stepwise in the direction of arrow relative to the substrate 5 and then irradiated in one shot (third shot) onto the gate electrode 1 at a position apart from the irradiation position of the second shot of FIG. 2B and FIG. 3B by d/5 in the direction of arrow as shown in FIG. 2C and FIG. 3C. As a result, an overlap among the three shots (first to third shots) of the laser light L has been exposed to a still higher laser fluence than the previous two shots. At such overlap, the irradiation energy is further increased and crystallization (crystal growth) of the polysilicon thin film 8 is further promoted. Thus, the crystal grain size of the polysilicon thin film 8 at such overlap is larger than the other portion thereof.

Figure 2D:
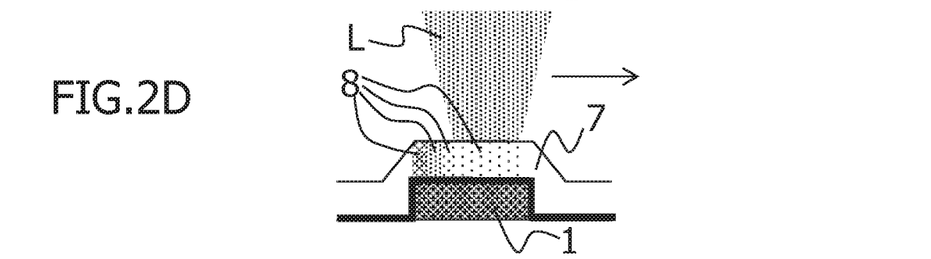
Figure 3D:
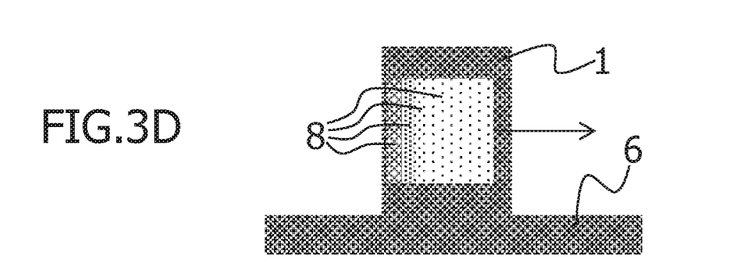

In addition, similar to the above, the laser light L is moved stepwise in the direction of arrow relative to the substrate 5 and then irradiated in one shot (fourth shot) onto the gate electrode 1 at a position apart from the third shot as shown in FIG. 2C and FIG. 3C by d/5 in the direction of arrow in FIG. 2D and FIG. 3D. As a result, an overlap among the four shots of the laser light L (first to fourth shots) has been exposed to a much higher laser fluence than the previous three shots. At such overlap, the irradiation energy is further increased and crystallization (crystal growth) of the polysilicon thin film 8 is more promoted. Thus, the crystal grain size of the polysilicon thin film 8 at such overlap is much larger than the other portion thereof.

Figure 2E:
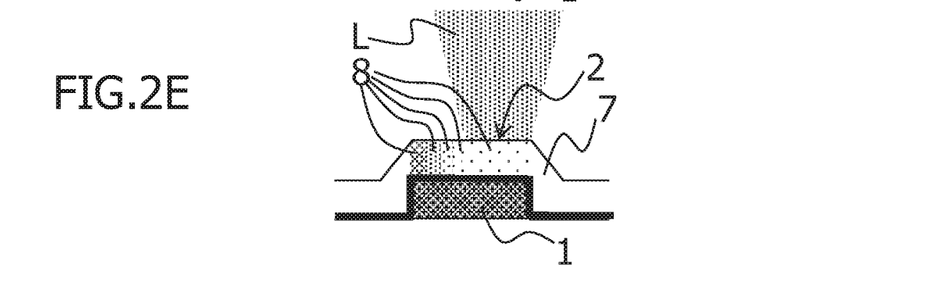
Figure 3E:
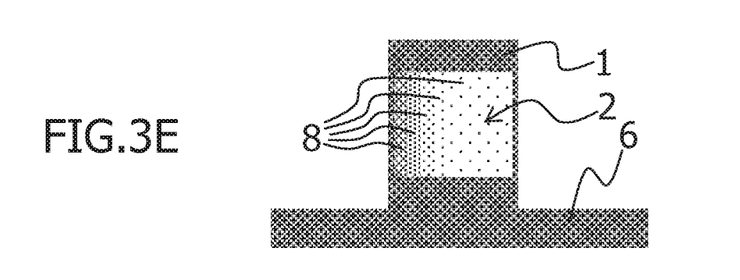

Moreover, similar to the above, the laser light L is moved stepwise in the direction of arrow relative to the substrate 5 and then irradiated in one shot (fifth shot as the last one) onto the gate electrode 1 in a position (end portion on the drain electrode 4 side) apart from the fourth shot of FIG. 2D and FIG. 3D by d/5 in the direction of arrow as shown in FIG. 2E and FIG. 3E. At this point, laser annealing for the amorphous silicon thin film 7 in the region corresponding to the gate electrode 1 is completed to obtain the polysilicon thin film 8 that serves as the semiconductor layer 2.

In this case, an overlap (central portion of the channel region 10) among the five shots of laser light L (first to fifth shots) has been exposed to a much higher laser fluence than the previous four shots. At such overlap, the irradiation energy is further increased and crystallization (crystal growth) is more promoted. Thus, the crystal grain size of the polysilicon thin film 8 at such overlap is much higher than the other portion thereof.

From the central portion of the channel region 10 toward its end on the drain electrode 4 side, the number of overlapped shots (i.e., overlapped irradiation positions of laser light L) reduces and thus, the laser fluence is decreased. Accordingly, the irradiation energy is gradually reduced from the central portion of the channel region 10 to the end on the drain electrode 4 side and likewise, the crystal grain size of the polysilicon thin film 8 is gradually reduced.

Figure 4:
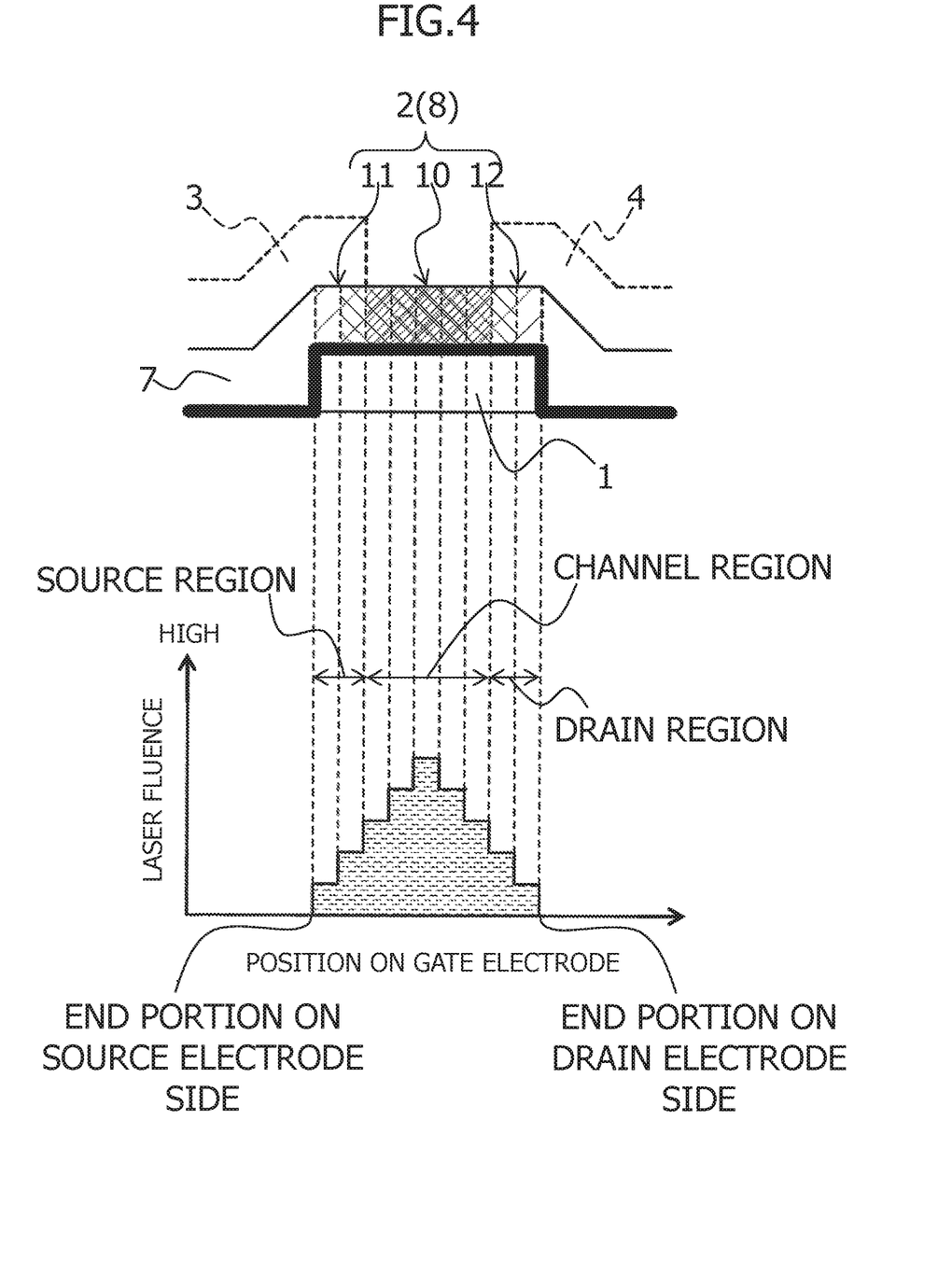
FIG. 4 is an explanatory view showing distribution of laser fluence upon the laser annealing.

As described above, the irradiation position of the laser light L is shifted stepwise by d/n, whereby the laser light L can be irradiated to the amorphous silicon thin film 7 on the gate electrode 1 with a fluence distribution as shown in FIG. 4. That is, as compared to the channel region 10, the fluence of the laser light L for the source region 11 and the drain region 12 can be reduced and crystallization (polysilicon) in the source region 11 and the drain region 12 is restrained. Thus, the crystal grain size of the polysilicon thin film 8 in the source region 11 and the drain region 12 can be smaller than that in the channel region 10.

Note that it is desirable to determine the requisite number of shots n by which the laser light L is irradiated for laser annealing so as to ensure enough irradiation energy to melt at least the entire amorphous silicon thin film 7 in the channel region 10.

As described above, according to the present invention, the crystal grain size of the polysilicon thin film 8 in the source region 11 and the drain region 12 can be made smaller than that in the channel region 10. Thus, the electron mobility in the source region 11 and the drain region 12 of the semiconductor layer 2 can be made lower than that of the channel region 10. Accordingly, the off-leakage current in the TFT can be reduced.

Figure 5:
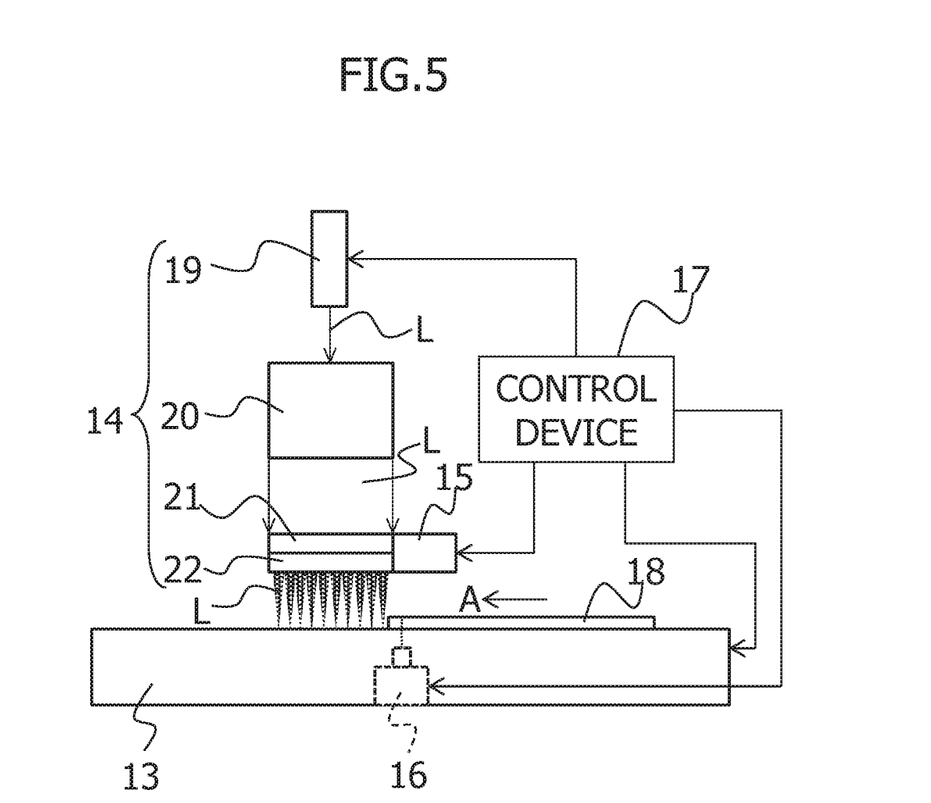
FIG. 5 is a front view showing a laser annealing apparatus according to an embodiment of the present invention.

Referring to FIG. 5, a laser annealing apparatus according to the present invention, which is used for the laser annealing step, is described next. The laser annealing apparatus of the present invention includes a scanning means 13, the laser irradiation optical system 14, an alignment means 15, an image pickup means 16, and a control device 17.

The scanning means 13 scans the TFT substrate 18 with the amorphous silicon thin film 7 being formed at the top thereof, in the direction of arrow A in FIG. 5 at a constant speed. The substrate can be positioned and placed on the scanning means 13 such that the gate lines 6 previously formed on the TFT substrate 18 extend in parallel with the scanning direction (direction of arrow A).

The laser irradiation optical system 14 is disposed above the scanning means 13. The laser irradiation optical system 14 serves to appropriately irradiate the laser light L as UV light to a predetermined position on the TFT substrate 18, and includes a laser 19, a coupling optical system 20, the shadow mask 21, and a microlens array 22, which are arranged in the stated order from the upstream side to the downstream side in the travel direction of the laser light L.

The laser 19 emits pulsed laser light L as UV light. To give an example thereof, a YAG laser having the wavelength of 355 nm and an excimer laser having the wavelength of 308 nm can be used.

Also, the coupling optical system 20 serves to expand and homogenize the laser light L emitted from the laser 19 and then irradiate the light to the shadow mask 21 as described below. The coupling optical system 20 includes, although not shown, a beam expander, a photointegrator, and a collimator lens.

Furthermore, the shadow mask 21 splits single laser light L into plural beams of laser light L. The shadow mask 21 has the plural apertures 25 that are formed in a light-shielding film 24 of chromium (Cr), aluminum (Al), or the like formed on a transparent quartz substrate 23 as shown in FIG. 6B. The apertures 25 are used for shaping the laser light L to be irradiated onto the TFT substrate 18 in the same shape as the channel region 10. The aperture pattern of the shadow mask 21 is similar to the irradiation pattern of the laser light L.

Figure 6A:
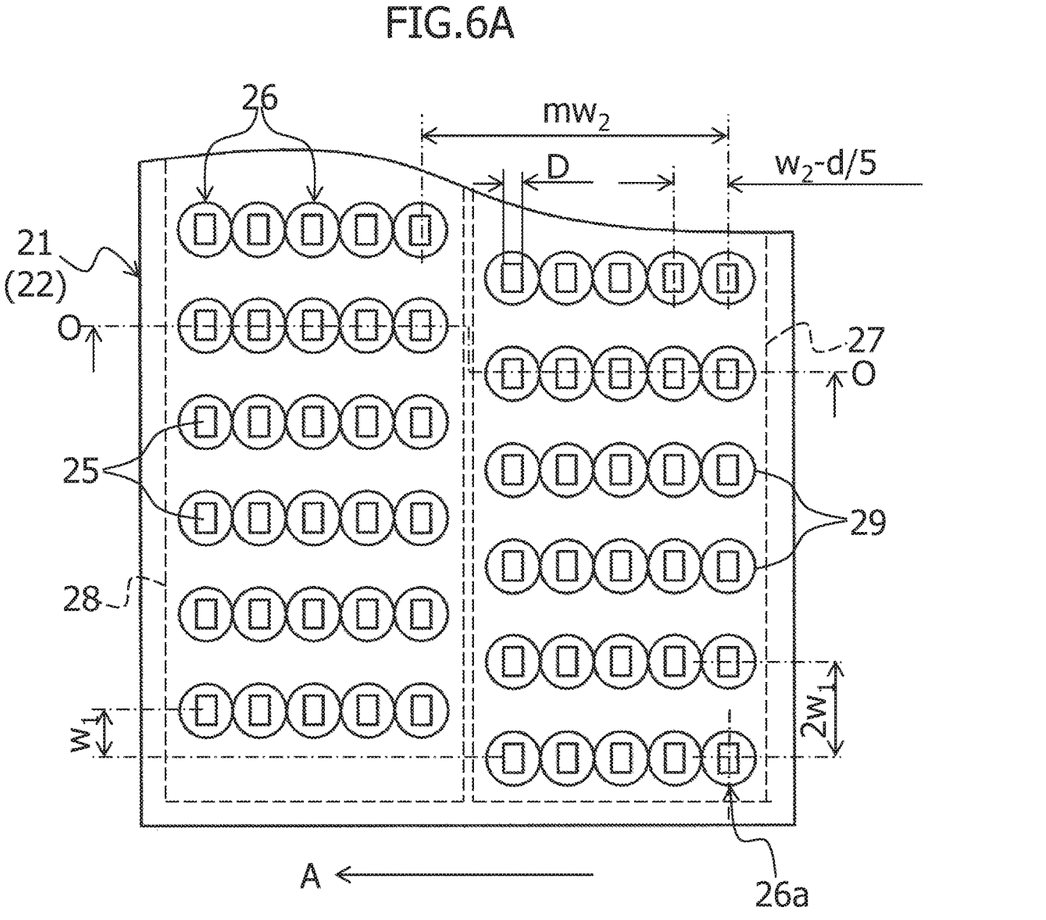
Figure 6B:
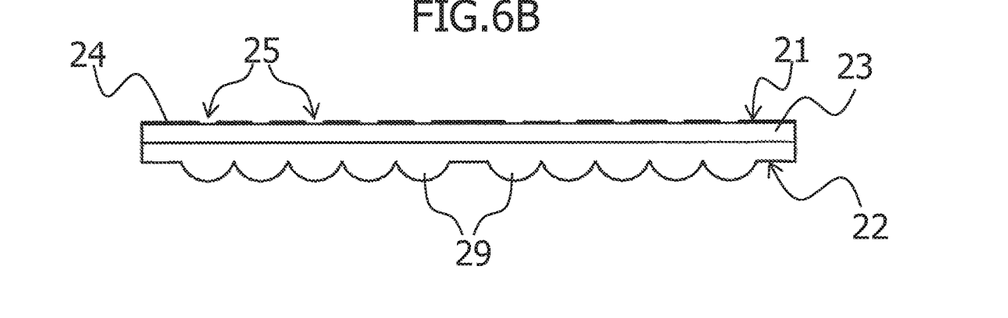

More specifically, as shown in FIG. 6A, the shadow mask 21 has plural aperture rows 26 provided in the scanning direction. Each aperture row 26 has plural apertures 25 arranged in line at a pitch that is an integer multiple of the array pitch $w_1$ (the integer is 2 or more, and the integer multiple is indicated by $2w_1$ in FIG. 6A) of the gate electrodes 1 in the direction crossing the scanning direction (direction of arrow A), the gate electrodes being formed in a matrix on the TFT substrate 18. Also, in order that the laser light L can be irradiated not only to the gate electrodes 1 through the apertures 25 of the plural aperture rows 26 disposed on the upstream side in the scanning direction (hereinafter referred to as "first aperture group 27") but also the other gate electrodes 1 positioned between the above gate electrodes 1, plural subsequent aperture rows 26 (hereinafter referred to as "second aperture group 28") are arranged apart from the upstream ones by a predetermined distance ($w_1$ in FIG. 6A) in the direction crossing the scanning direction.

More specifically, in the first and second aperture groups 27 and 28, the number of aperture rows 26 is equal to the number of shots by which the laser light L is irradiated for laser annealing (in FIG. 6A, five rows are provided). In this case, provided that D represents the width of each aperture 25 in the scanning direction, $w_2$ represents the array pitch of the gate electrodes 1 in the same direction, and n represents the number of shots by which the laser light L is irradiated for laser annealing, the interval between the adjoining aperture rows 26 in the first and second aperture groups 27 and 28 is set to "$w_2 \pm d/n$". Also, in the first and second aperture groups 27 and 28, the interval between the upstream aperture rows 26 of the respective aperture groups 27 and 28 in the scanning direction is set m times (where m indicates an integer not smaller than the number of shots n of the laser light L) longer than the array pitch $w_2$ of the gate electrodes 1 in the scanning direction. Note that in the illustrated example of FIG. 6A, n=5 and also, the interval between the adjoining aperture rows 26 is "$w_2 - d/n$".

The microlens array 22 projects images of the apertures 25 at a smaller scaling factor onto the gate electrode 1. As shown in FIGS. 6A and 6B, plural microlenses (condenser lenses) 29 are arranged such that their optical axes coincide with the centers of the respective apertures 25 in the first and second aperture groups 27 and 28. In this case, the scaling factor of the microlens 29 is set so as to focus images of the apertures 25 on the amorphous silicon thin film 7 on the gate electrode 1 in conformity with the shape of the channel region 10. As a result, the width D of each aperture 25 in the scanning direction is reduced to the above scaling factor of the microlens 29, and consequently matches the source-drain width d of the channel region 10.

The alignment means 15 is provided so as to move the shadow mask 21 and the microlens array 22 together in the direction crossing the scanning direction. The alignment means 15 serves to appropriately irradiate the laser light L to a target position and move the shadow mask 21 and the microlens array 22 following the motions of the TFT substrate 18 that is scanned swaying right and left with respect to the scanning direction.

The image pickup means 16 is provided at the scanning means 13 in a position below the scanning surface. The image pickup means 16 is a line camera that captures images of the gate electrode 1 and the gate line 6 formed on the surface of the TFT substrate 18 from the back of the TFT substrate 18 through the transparent glass of the TFT substrate 18. The image pickup means 16 has an elongated light receiving surface where plural light receiving elements are arranged in line in the direction crossing the scanning direction. Also, the image pickup means 16 is disposed such that the longitudinal center line of the light receiving surface matches the center line of the most upstream aperture row 26a in the scanning direction (direction of arrow A) of the shadow mask 21. Alternatively, the image pickup means 16 is disposed so as to capture an image of a portion that is apart from the above aperture row 26a by a predetermined distance toward the upstream side in the scanning direction.

The control device 17 is provided, which is electrically connected to the scanning means 13, the laser irradiation optical system 14, the alignment means 15, and the image pickup means 16. In order that the crystal grain size of the polysilicon thin film 8 in the source region 11 and the drain region 12 (the regions corresponding to the source electrode 3 and the drain electrode 4 on the TFT substrate 18) can be smaller than that in the channel region 10 between the source electrode 3 and the drain electrode 4, the control device 17 controls the fluence of the laser light L so as to irradiate the laser light L for laser annealing onto the source region 11 and the drain region 12 at a smaller fluence than in the channel region 10.

More specifically, the control device 17 controls the distance the irradiation position of the laser light L moves stepwise (amount of stepwise movement) so as to shift the irradiation position stepwise in the region corresponding to the gate electrode 1 from one end on the source electrode 3 side or the drain electrode 4 side to the other end with some overlap. In this case, the laser light L has been shaped to be irradiated in the same shape as the channel region 10. This provides such fluence distribution that the fluence of the laser light L can be higher in the channel region 2 than the other portions.

More specifically, the control device 17 controls the moving speed of the TFT substrate 18 in the opposing direction of the source electrode 3 and the drain electrode 4 (scanning direction) and the timing of irradiating the laser light L to ensure that the laser annealing is performed by multiply irradiating plural beams of laser light L past plural apertures 25 arranged along the same direction, out of the plural apertures 25.

Figure 7:
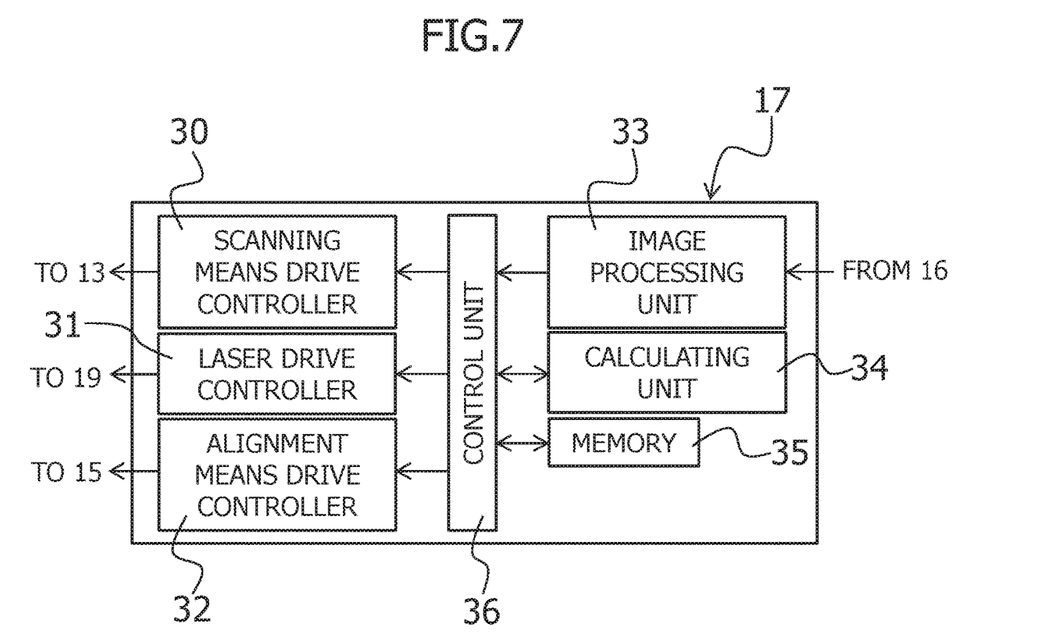
FIG. 7 is a block diagram showing one structural example of a control device of the laser annealing apparatus according to the present invention.

Furthermore, as shown in FIG. 7, the control device 17 includes a scanning means drive controller 30, a laser drive controller 31, an alignment means drive controller 32, an image processing unit 33, a calculating unit 34, a memory 35, and a control unit 36.

In this example, the scanning means drive controller 30 controls driving of the scanning means 13 so as to scan the TFT substrate 18 at a predetermined speed in the direction of arrow A. The laser drive controller 31 controls driving of the laser 19 so as to emit pulsed laser light L at predetermined time intervals. The alignment means drive controller 32 executes control so as to move the shadow mask 21 and the microlens array 22 both together in the direction crossing the scanning direction following the motions of the TFT substrate 18 that is scanned swaying right and left with respect to the scanning direction.

The image processing unit 33 detects an edge portion of the gate electrode 1 that crosses the scanning direction in accordance with luminance change in the scanning direction based on image information captured by the image pickup means 16. Also, the image processing unit 33 detects a position of the edge portion of the gate line 6 extending in parallel to the scanning direction in accordance with luminance change in the direction crossing the scanning direction (luminance change in the longitudinal axis direction of the light receiving surface). The image processing unit 33 outputs the above detection information and reference position information preset in the image pickup means 16 to a calculating unit 34 as described below.

The calculating unit 34 receives from the image processing unit 33 the detection information about the edge portion of the gate electrode 1 that crosses the scanning direction, and calculates the distance the TFT substrate 18 moves from the time of detection. If the distance of movement of the TFT substrate 18 matches a target value thereof, and the irradiation position of the laser light L corresponding to the aperture 25 in the most upstream aperture row 26a of the shadow mask 21 in the scanning direction matches the first irradiation position in the end portion on the source electrode 3 side on the gate electrode 1, the calculating unit 34 outputs to the laser drive controller 31 a command to emit one pulse of laser light L. Also, comparing position information about an edge portion of a previously chosen gate line 6 out of the position information about the edge portion of the respective gate lines 6 in parallel to the scanning direction, with reference position information preset in the image pickup means 16, the calculating unit 34 calculates the distance therebetween and in turn calculates a difference between the distance and an alignment target value and then outputs the difference information (offset information) to the alignment means drive controller 32. Hence, the alignment means drive controller 32 drives the alignment means 15 so as to correct the offset based on the offset information.

The memory 35 is a rewritable storage device adapted to store a scanning speed of the TFT substrate 18 and the aforementioned target values, etc. The control unit 36 executes control over the whole apparatus to ensure the respective elements can properly operate.

Next, operations of the thus-configured laser annealing apparatus are described. In this example, one gate electrode 1 is taken as an example, and five shots of the laser light L are applied for laser annealing. First of all, the control device 17 controls the scanning means 13 to start scanning the TFT substrate 18 at a constant speed in the direction of arrow A in FIG. 5.

Next, the image pickup means 16 captures images of the gate electrode 1 and the gate line 6 formed on the surface from the back of the TFT substrate 18 through the TFT substrate 18. In this case, the images captured with the image pickup means 16 are processed by the image processing unit 33, and if the edge portion (crossing the scanning direction) of the most downstream gate electrode 1 in the scanning direction, is detected based on a luminance change in the scanning direction, the calculating unit 34 calculates the distance the TFT substrate 18 moves from the time of detection of the edge portion as a reference time. If the distance of movement matches a target value thereof stored in the memory 35, and the irradiation position of the laser light L corresponding to the aperture 25 of the most upstream aperture row 26a of the shadow mask 21 in the scanning direction matches a preset first irradiation position in the end portion on the source electrode 3 side on the gate electrode 1, the calculating unit 34 outputs to the laser drive controller 31 a command to emit one pulse of laser light L.

Moreover, the image processing unit 33 detects an edge portion of the gate line 6 parallel to the scanning direction based on luminance change of the image captured with the image pickup means 16 in the direction crossing the scanning direction. The obtained position information is output to the calculating unit 34. Comparing the position information of the edge portion (for example, the right edge portion in the scanning direction) of the previously chosen gate line 6 out of the received position information with reference position information preset in the image pickup means 16, the calculating unit 34 calculates the distance therebetween and in turns calculates a difference between the distance and an alignment target value stored in the memory 35. Then, the calculating unit 34 outputs the difference information (offset information) to the alignment means drive controller 32.

The alignment means drive controller 32 drives the alignment means 15 so as to correct the offset based on the offset information, and slightly moves the shadow mask 21 and the microlens array 22 both together in the direction crossing the scanning direction. Hence, the shadow mask 21 and the microlens array 22 move following the motions of the TFT substrate 18 in the direction crossing the scanning direction to ensure the laser light L can be properly applied to a predetermined position on the gate electrode 1. The shadow mask 21 and the microlens array 22 follow the motions of the TFT substrate 18 all the time during scanning thereof.

The laser drive controller 31 drives the laser 19 based on the light emission command received from the calculating unit 34 so as to emit one pulse of laser light L. The laser light L emitted from the laser 19 is irradiated to the shadow mask 21 after its beam diameter has been expanded and its luminance distribution has been homogenized by the coupling optical system 20.

Figure 8A:
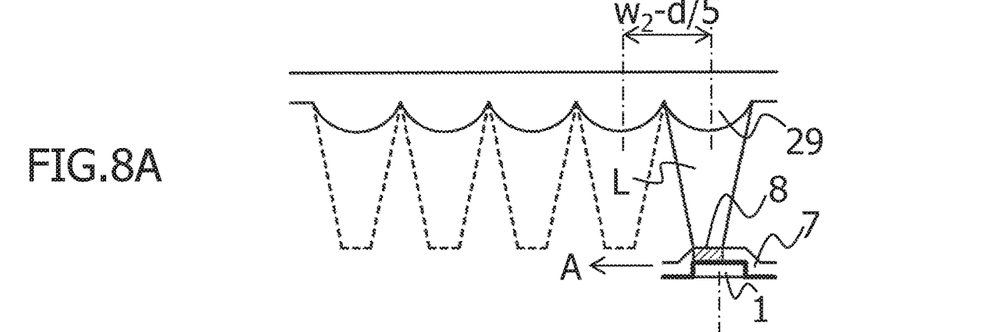
FIGS. 8A to 8E are explanatory views showing laser annealing operations of the laser annealing apparatus according to the present invention.

The laser light L irradiated to the shadow mask 21 is split into plural beams of laser light L through the plural apertures 25 of the shadow mask 21. Moreover, the plural split beams of laser light L are, as shown in FIG. 8A, focused by the microlenses 29 corresponding to the respective apertures 25 onto the first irradiation position of the amorphous silicon thin film 7 on the gate electrode 1. At this time, a reduced image of the respective apertures 25 is projected onto the amorphous silicon thin film 7, and the laser light L illuminates a portion corresponding to the channel region 10. As a result, the amorphous silicon thin film 7 illuminated by the first shot of laser light L at the first irradiation position, is instantaneously heated and melted. Then, the amorphous silicon thin film 7 is partially crystallized into polysilicon.

Figure 8B:
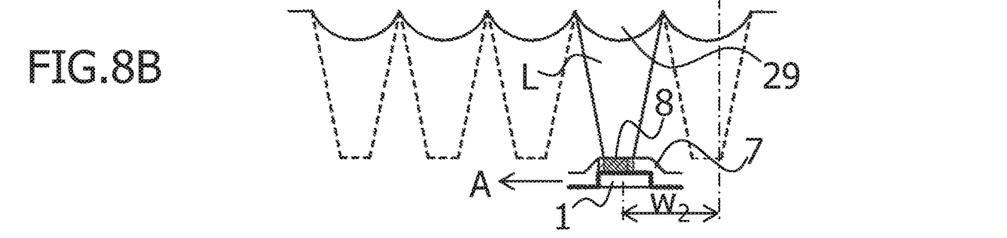

The calculating unit 34 calculates the distance the TFT substrate 18 moves. If the TFT substrate 18 moves the distance equal to the array pitch $w_2$ of the gate electrodes 1 in the scanning direction, which value is stored in the memory 35, and as shown in FIG. 8B, the gate electrode 1 reaches the position below the next downstream microlens 29 in the scanning direction, the calculating unit 34 outputs to the laser drive controller 31, a command to emit a second shot. In response to the command, the laser drive controller 31 drives the laser 19 so as to emit the second shot of laser light L.

As shown in FIG. 8B, the second shot of laser light L is focused onto the amorphous silicon thin film 7 on the gate electrode 1 by means of the microlenses 29. Then, a portion of the amorphous silicon thin film 7 illuminated by the second shot of laser light L is instantaneously heated and melted, and the amorphous silicon thin film 7 is partially crystallized into polysilicon. In this case, as shown in FIG. 8A, the apertures 25 and the microlenses 29 are respectively arranged at the pitch of "$w_2-d/5$" in the scanning direction. It means the second shot of the laser light L has been irradiated to the position shifted by d/5 to the upstream side in the scanning direction from the first shot of laser light L. Note that d indicates the width of the channel region 10 in the scanning direction.

An overlap between the first and second shots of laser light L achieves higher irradiation energy than the portion exposed to the first shot alone, and crystallization of the polysilicon thin film 8 is promoted there.

Figure 8C:
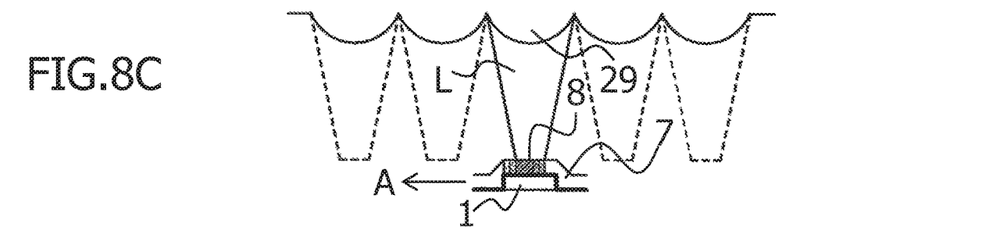
Figure 8D:
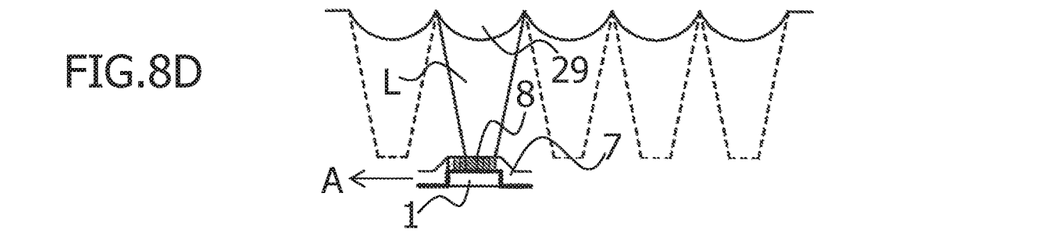
Figure 8E:
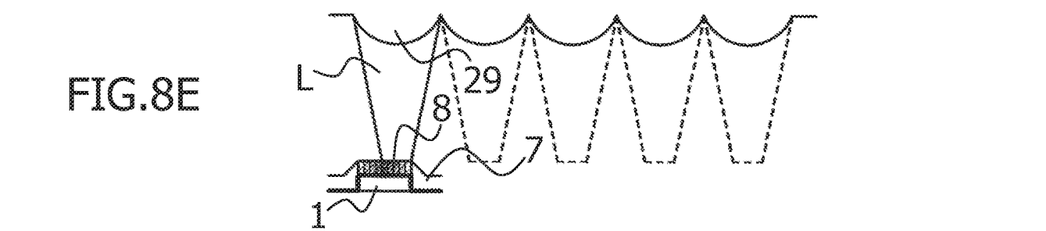

A subsequent procedure is illustrated in FIGS. 8C to 8E. That is, the laser light L is emitted each time the TFT substrate 18 moves by $w_2$ and thus, the third to fifth shots of laser light L are irradiated onto the amorphous silicon thin film 7 on the gate electrode 1. In this case, the third to fifth shots of laser light L are irradiated to the positions shifted by d/5 to the upstream side in the scanning direction from one to another.

As described above, as the first to fifth shots of laser light L overlap more, the fluence of laser light L increases and the irradiation energy becomes higher, whereby the polysilicon thin film 8 is further crystallized (i.e., crystal growth is promoted). Thus, the crystal grain size of the polysilicon thin film 8 in the channel region 10 exposed to a high laser fluence, is larger than that in the source region 11 and the drain region 12 exposed to a low laser fluence. In this way, it is possible to obtain the semiconductor layer 2, in which the crystal grain size of the polysilicon thin film 8 in the source region 11 and the drain region 12 is smaller than in the channel region 10.

Note that in the above illustrated embodiment, the apertures 25 and the microlenses are arranged at the pitch of "$w_2-d/5$" in the scanning direction, but the present invention is not limited thereto and the array pitch may be set to "$w_2+d/5$".

Figure 9A:
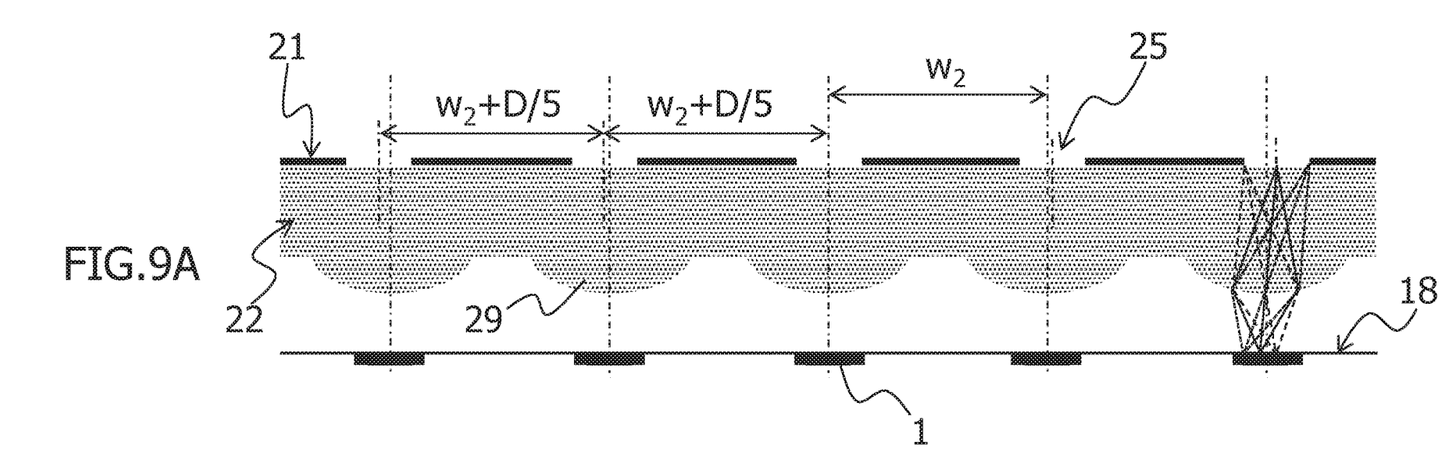

Also, in the above illustrated embodiment, the shadow mask 21 and the microlens array 22 are arranged with the center of the aperture 25 coinciding with the optical axis of the microlens 29, but the present invention is not limited thereto. As shown in FIG. 9A, the microlens array 22 can be provided so that the microlenses 29 are arranged at the same array pitch in the scanning direction as the array pitch $w_2$ of the gate electrodes 1 in the same direction. In this case, it is desirable to arrange the apertures 25 at the array pitch of "$w_2 \pm D/n$" in the scanning direction such that the center of the middle aperture 25 coincides with the optical axis of a corresponding microlens 29. Note that in the illustrated example of FIG. 9A, the array pitch is "$w_2+D/n$" and n=5.

Figure 9B:
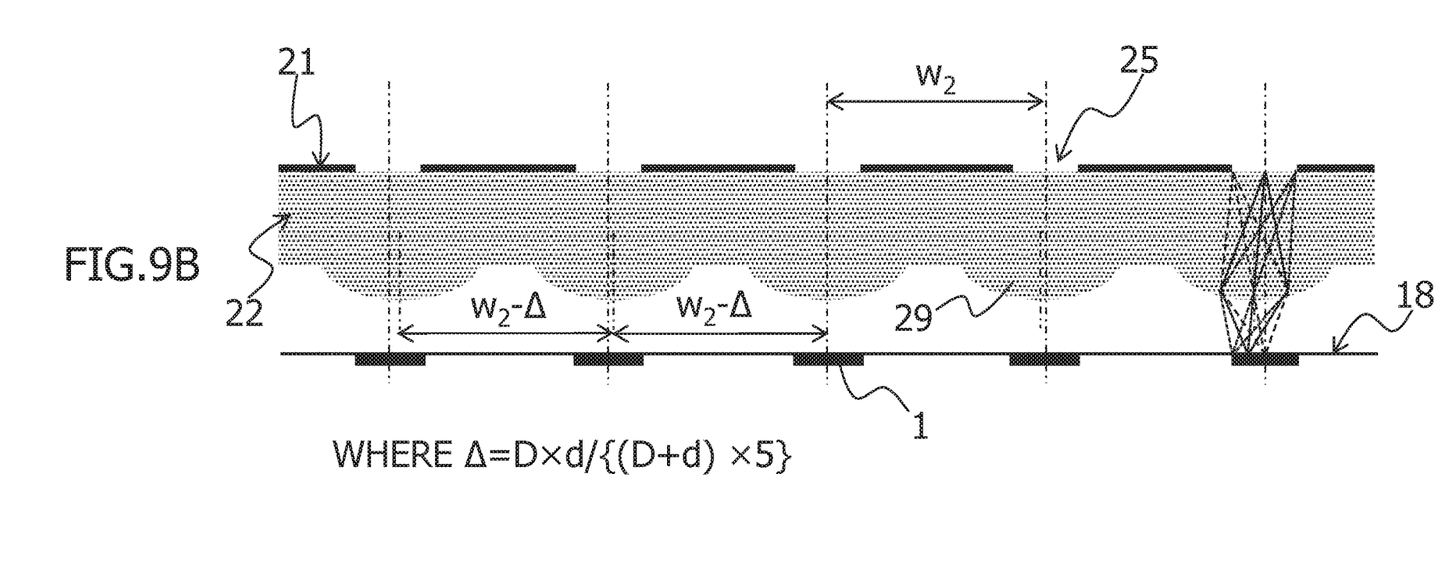

Alternatively, as shown in FIG. 9B, the shadow mask 21 can be provided so that the apertures 25 are arranged at the same array pitch in the scanning direction as the array pitch $w_2$ of the gate electrodes 1 in the same direction. In this case, it is desirable to provide the microlenses 29 at the array pitch of "$w_2 \pm D \times d/[(D+d) \times n]$" (in FIG. 9B, the array pitch is "$w_2 - D \times d/[(D+d) \times n]$" and n=5) in the scanning direction so that the optical axis of the middle microlens 29 coincides with the center of a corresponding aperture 25.

Figure 10:
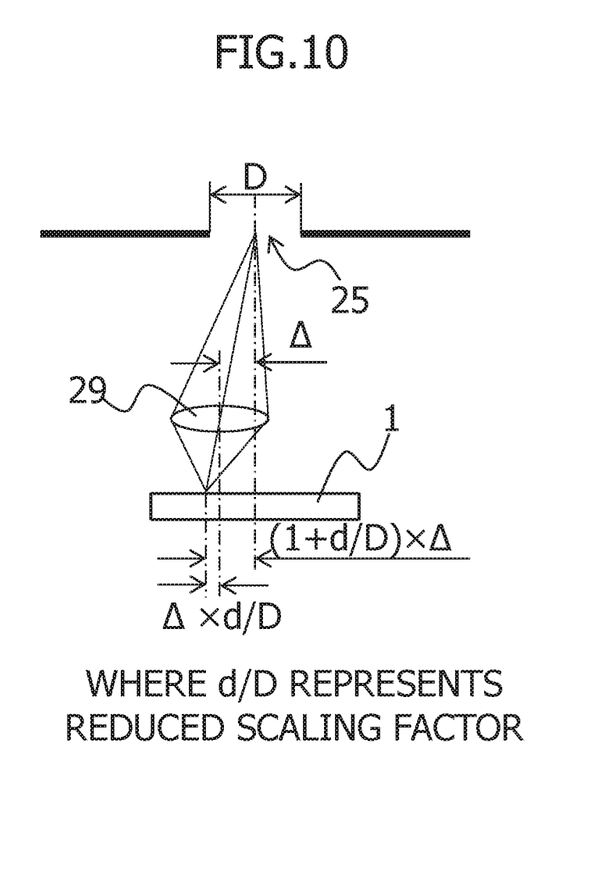
FIG. 10 is an explanatory view illustrating the microlens array of FIG. 9B.

This is described in more detail with reference to FIG. 10. First of all, discussed are the middle aperture 25, the apertures 25 on the right of the microlens 29, and the microlens 29 as shown in FIG. 9B. In this case, as shown in FIG. 10, the center of the image of the aperture 25 projected onto the gate electrode 1 is shifted from the optical axis of the microlens 29 by "$\Delta \times d/D$" where $\Delta$ indicates an offset amount between the center of the aperture 25 and the optical axis of the microlens 29, and d/D corresponds to a reduced scaling factor of the microlenses 29. Accordingly, the distance between the center line of the aperture 25 and the center line of the image of the aperture 25 on the gate electrode 1, is expressed by "$(1+d/D) \times \Delta$".

In this case, since the center of the middle aperture 25 and the optical axis of the microlens 29 coincide with each other, the center line of the image of the middle aperture 25 matches the center line of the aperture 25, but an image of the aperture 25 on the right of the middle aperture 25 is shifted from the center line of the middle aperture 25 by "(1+d/D)×Δ". An amount of such offset is d/n, which equals "1+d/D)×Δ" (1+d/D×Δ=d/n). The offset amount is expressed as follows: A=D×d/[(D+d)×n]. Thus, the microlenses 29 have only to be arranged at the pitch of "$w_2 \pm \Delta$", i.e., "$w_2 \pm D \times d/[(D+d) \times n]$" in the scanning direction so that the optical axis of the middle microlens 29 coincides with the center of a corresponding apertures 25.

Moreover, in the illustrated embodiment, the microlens array 22 have plural microlenses corresponding to the apertures 25 on a one-to-one basis. Alternatively, one microlens 29 can be provided with respect to plural apertures 25 (aperture groups). In this case, it is desirable to provide plural aperture groups and the microlenses 29 so as to interpolate regions between plural regions in the direction crossing the scanning direction, projected by plural microlenses 29 corresponding to plural aperture groups of the upstream side in the scanning direction, by use of subsequent aperture groups.

It should also be understood that many modifications and variations of the described embodiments of the invention will be apparent to a person having an ordinary skill in the art without departing from the spirit and scope of the present invention as claimed in the appended claims.

What is claimed is:

1. A thin film transistor comprising:
   a gate electrode;
   an insulating layer provided over the gate electrode;
   a semiconductor layer which has a width same as a width of the gate electrode and which is arranged above the gate electrode and above the insulating layer, wherein the semiconductor layer is a polysilicon film;
   a source electrode provided over a first end portion of the semiconductor layer; and
   a drain electrode provided over a second end portion of the semiconductor layer,
   wherein the gate electrode, the insulating layer, the semiconductor layer and the source and drain electrodes are sequentially laminated on a substrate,
   wherein the semiconductor layer comprises a source region, a channel region, and a drain region,
   wherein the source region is located at the first end portion of the semiconductor layer and located between the source electrode and the gate electrode,
   wherein the drain region is located at the second end portion of the semiconductor layer and located between the drain electrode and the gate electrode,
   wherein the channel region is located between the source region and the drain region, and
   wherein a crystal grain size of the polysilicon film in the source region and the drain region is smaller than a crystal grain size of the polysilicon film in the channel region.

2. A thin film transistor according to claim 1, wherein the semiconductor layer is a region in which an amorphous silicon thin film is deposited over the substrate, and the amorphous silicon thin film arranged above the gate electrode is crystallized into polysilicon.

3. A thin film transistor according to claim 1, wherein a width of the channel region between the source region and the drain region is smaller than a width of the gate electrode in an opposing direction of the source and drain electrodes.

* * * * *